US012372988B2

United States Patent
Jiang et al.

(10) Patent No.: US 12,372,988 B2
(45) Date of Patent: Jul. 29, 2025

(54) METHOD OF CONTROLLING MIXED LIQUID TO BE DELIVERED FOR SPM SOLUTION

(71) Applicants: PNC PROCESS SYSTEMS CO., LTD., Shanghai (CN); ULTRON SEMICONDUCTOR (SHANGHAI) CO., LTD., Shanghai (CN)

(72) Inventors: Yuan Jiang, Shanghai (CN); Dawei Liu, Shanghai (CN); Jing Zhang, Shanghai (CN); Zhengkai Lu, Shanghai (CN); Ming Xu, Shanghai (CN); Panpan Li, Shanghai (CN); Fangyi Lv, Shanghai (CN); Chuanlong Liu, Shanghai (CN)

(73) Assignees: PNC PROCESS SYSTEMS CO., LTD., Shanghai (CN); ULTRON SEMICONDUCTOR (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 19/023,829

(22) Filed: Jan. 16, 2025

(65) Prior Publication Data

US 2025/0155903 A1    May 15, 2025

Related U.S. Application Data

(63) Continuation of application No. PCT/CN2023/106070, filed on Jul. 6, 2023.

(30) Foreign Application Priority Data

Dec. 15, 2022   (CN) .......................... 202211617093.3

(51) Int. Cl.
  *G05D 11/13*  (2006.01)
  *G05D 16/20*  (2006.01)
  (Continued)

(52) U.S. Cl.
  CPC ........... *G05D 11/131* (2013.01); *G05D 16/20* (2013.01); *G05D 23/132* (2013.01); *H01L 21/6704* (2013.01)

(58) Field of Classification Search
  None
  See application file for complete search history.

(56) References Cited

U.S. PATENT DOCUMENTS

| 2015/0114432 A1 | 4/2015 | Iwata et al. |
| 2017/0025268 A1 | 1/2017 | Hyakutake et al. |
| (Continued) | | |

FOREIGN PATENT DOCUMENTS

| CN | 110364431 A | 10/2019 |
| CN | 111403268 A | 7/2020 |
| CN | 115938990 A | 4/2023 |

OTHER PUBLICATIONS

International Search Report of PCT/CN2023/106070, Oct. 16, 2023.

*Primary Examiner* — Omair Chaudhri
(74) *Attorney, Agent, or Firm* — Troutman Pepper Locke LLP; Tim Tingkang Xia, Esq.

(57) ABSTRACT

A method of controlling mixed liquid to be delivered for SPM solution includes: before the SPM solution comes into an acid scouring tank, mixing the sulfuric acid with the hydrogen peroxide in a delivering pipe in a first stage and a second stage in turn, so as to make a mixed liquid after mixing in the first stage to further get mixed in the second stage; heating the mixed liquid in the first stage; monitoring an oxygen concentration value of the mixed liquid flowing out after mixing in the first stage; and if the oxygen concentration value is smaller than an oxygen concentration value at full reaction, adding supplementary sulfuric acid and hydrogen peroxide during mixing in the second stage, so as to enable the oxygen concentration value of the mixed (Continued)

liquid flowing out after mixing in the second stage monitored in real time to reach an oxygen concentration value.

9 Claims, 4 Drawing Sheets

(51) Int. Cl.
  *G05D 23/13* (2006.01)
  *H01L 21/67* (2006.01)

(56) References Cited

U.S. PATENT DOCUMENTS

| | | | |
|---|---|---|---|
| 2019/0308224 A1* | 10/2019 | Hayashi | B01F 23/49 |
| 2019/0371628 A1* | 12/2019 | Yasuda | H01L 21/67034 |
| 2025/0025908 A1* | 1/2025 | Marumoto | H01L 21/67017 |

* cited by examiner

METHOD OF CONTROLLING MIXED LIQUID TO BE DELIVERED FOR SPM SOLUTION

FIELD OF THE INVENTION

This application is a continuation application of International Application No. PCT/CN2023/106070, filed on Jul. 6, 2023, which itself claims priority to Chinese Patent Application No. 202211617093.3, filed on Dec. 15, 2022. The disclosure of each of the above-mentioned applications is hereby incorporated by reference.

FIELD OF THE INVENTION

The present invention relates to wafer cleaning processes in the technical field of wafer fabrication, in particular to a method of controlling mixed liquid to be delivered for SPM solution.

BACKGROUND OF THE INVENTION

In the process of cleaning semiconductor wafers, a tank-type cleaning device as special equipment is commonly used for cleaning chemicals off wafers, and so far, some technical solutions suitable for different processes of cleaning wafers have been provided for different wafer products in use. In each of various processes commonly used for cleaning wafers, such as a process of removing films, a process of degumming, a process of cleaning organic compounds off wafers, and a process of removing some metal surface structures or metal residues, it is often necessary to use an active SPM-peroxy-sulfuric acid mixture solution formed by mixing sulfuric acid ($H_2SO_4$) with hydrogen peroxide ($H_2O_2$) and ultrapure water in relative concentration at a specified volume ratio to clean wafers, for example, to clean wafers with various active SPM-peroxy-sulfuric acid mixture solutions such as SPM or DSP+ formed by adding ozone water. The active SPM-peroxy-sulfuric acid mixture solution will exert corrosive action upon any of various semiconductor materials such as silicon (Si), silicon carbide (SiC), gallium nitride (GaN) and gallium arsenide (GaAs), and common metals and various organic compounds with loose molecular chain structure, so as to achieve the functions of cleaning, etching and removal, so it is often used in the processes of cleaning semiconductor wafers.

For a process of cleaning with SPM adapted to tank-type devices, a source pipe used for correspondingly supplying sulfuric acid ($H_2SO_4$), hydrogen peroxide ($H_2O_2$) and ultrapure water leads from a corresponding pipe to a corresponding acid scouring tank via a delivering pipe, a circulation pipe, a circulation pump, a filter, a rear mixer, a temporarily, storing tank and a rear output pipe that are corresponding to these two pipes respectively, so as to perform preparatory actions for cleaning. However, problems such as unevenness in mixture, large error in temperature control, and inadequacy in reaction still occur in this delivering process. These problems can lead to fatal defects in the process of cleaning with SPM adapted to tank-type devices, resulting in a decrease in capability of cleaning.

SUMMARY OF THE INVENTION

Therefore, the technical problem to be solved by the present invention is how to provide a method of controlling mixed liquid to be delivered for SPM solution, which enables the SPM solution to fully react in a delivering pipe before it is delivered to an acid scouring tank, so as to overcome the defects existing in the prior art.

In order to solve the above-mentioned technical problem, the present invention adopts the following technical solution.

A method of controlling mixed liquid to be delivered for SPM solution formed by mixing sulfuric acid with hydrogen peroxide, comprises the steps of: before the SPM solution comes into an acid scouring tank, mixing the sulfuric acid with the hydrogen peroxide at a specified volume ratio in a delivering pipe in a first stage and a second stage in turn, so as to make a mixed liquid after mixing in the first stage to further get mixed in the second stage; heating the mixed liquid in the first stage; monitoring in real time an oxygen concentration value of the mixed liquid flowing out after mixing in the first stage; and if the oxygen concentration value is smaller than an oxygen concentration value at full reaction, adding supplementary sulfuric acid and hydrogen peroxide at a specified volume ratio during mixing in the second stage, so as to enable the oxygen concentration value of the mixed liquid flowing out after mixing in the second stage monitored in real time to reach an oxygen concentration value at full reaction.

In the method according to the present invention, by ways of mixing the sulfuric acid with the hydrogen peroxide in the first stage and the second stage in turn and monitoring the oxygen concentration value after mixing in the first stage, in the case that the oxygen concentration value is smaller than an oxygen concentration value at full reaction, it is possible to ensure that the sulfuric acid and the hydrogen peroxide fully react with each other by adding supplementary sulfuric acid and hydrogen peroxide during mixing in the second stage.

As a further improvement of the present invention, the method further comprises the steps of: making the mixed liquid flowing out after mixing in the second stage further get mixed in a third stage in the delivering pipe; if the temperature value of the mixed liquid flowing out after mixing in the first stage is smaller than a required value, continuing to heat during mixing in the second stage; if the temperature of the mixed liquid flowing out after mixing in the second stage is smaller than a required value, continuing to heat during mixing in the third stage. In view of the situation monitored in multi-stage that the temperature value of the mixed liquid is smaller than a required value, it is possible to make the temperature meet the required value by ways of continuously heating in multi-stage, thus further ensure accuracy of controlling temperature.

As a further improvement of the present invention, the method further comprises the step of: if the oxygen concentration value of the mixed liquid after mixing in the second stage or after mixing in the third stage mixing is smaller than an oxygen concentration value at full reaction, continuing to add supplementary sulfuric acid and hydrogen peroxide at a specified volume ratio at the time of mixing in the second stage. By ways of further monitoring and adjusting the oxygen concentration of the mixed liquid after mixing in the latter two stages, it is possible to further ensure the mixed liquid to fully react.

As a further improvement of the present invention, the method further comprises the step of: if the temperature value of the mixed liquid after mixing in the second stage is bigger than a required value, continuing to cool the mixed liquid at the time of mixing in the third stage. By ways of monitoring the situation that the temperature value of the mixed liquid is bigger than a required value, it is possible to make the temperature meet the required value under the action of cooling and adjusting of circulating cooling water, thus further ensure accuracy of controlling temperature.

In a specific mode of realizing the present invention, in the first stage, the second stage and the third stage, the mixing is performed by using a mixing duct having a multi-section mixing screw rod inside. In the case of adopting this kind of mixing, the sulfuric acid and the hydrogen peroxide at the time of gathering together collide with the spiral plane of the mixing screw rod and make it rotate, in this way the shear force arising from this rotation can make the sulfuric acid and the hydrogen peroxide permeate through each other, and make the sulfuric acid and the hydrogen peroxide mix fully and evenly under the action of collision and rotation from the multi-section mixing screw rod.

In a specific mode of realizing the present invention, the heating is performed by the way of wrapping a heating tube around the mixing duct to heat the mixed liquid inside the mixing duct. This mode of heating achieves heating inflow liquid while mixing.

In a specific mode of realizing the present invention, the cooling is performed by the way of feeding circulating cooling water outside the mixing duct to cool the mixed liquid inside the mixing duct. This mode of cooling achieves cooling inflow liquid while mixing.

As a further improvement of the present invention, the method further comprises the step of: if the temperature value of the mixed liquid flowing out after mixing in the third stage is smaller than a required value, supplementarily heating the mixed liquid flowing out from mixing in the third stage in the delivering pipe. This mode of supplementarily heating further ensures precise control to temperature.

As a further improvement of the present invention, the method further comprises the steps of: monitoring gas pressure values of the mixing duct, and if a monitored gas pressure value is bigger than a set value, relieving pressure from the mixing duct. This mode of monitoring and controlling pressure ensures the system to safely operate.

In a specific mode of realizing the present invention, the method further comprises the step of: delivering the mixed liquid the temperature and oxygen concentration values of which after mixing in any stage meet a required value directly to a SPM storage tank for storage in heat preservation, so as to get ready to directly deliver it to the acid scouring tank.

In the present invention, by ways of adopting the above-mentioned technical solution, it is possible to realize fully mixing sulfuric acid with hydrogen peroxide in a mode of mixing in multi-stages, achieve precise control to temperature, and enable mixed liquid to fully react, thereby ensuring that the mixed liquid coming into the acid scouring tank meets cleaning requirements, and improving quality and efficiency of cleaning wafers.

DETAILED DESCRIPTION OF SOME EMBODIMENTS

Figure 1:
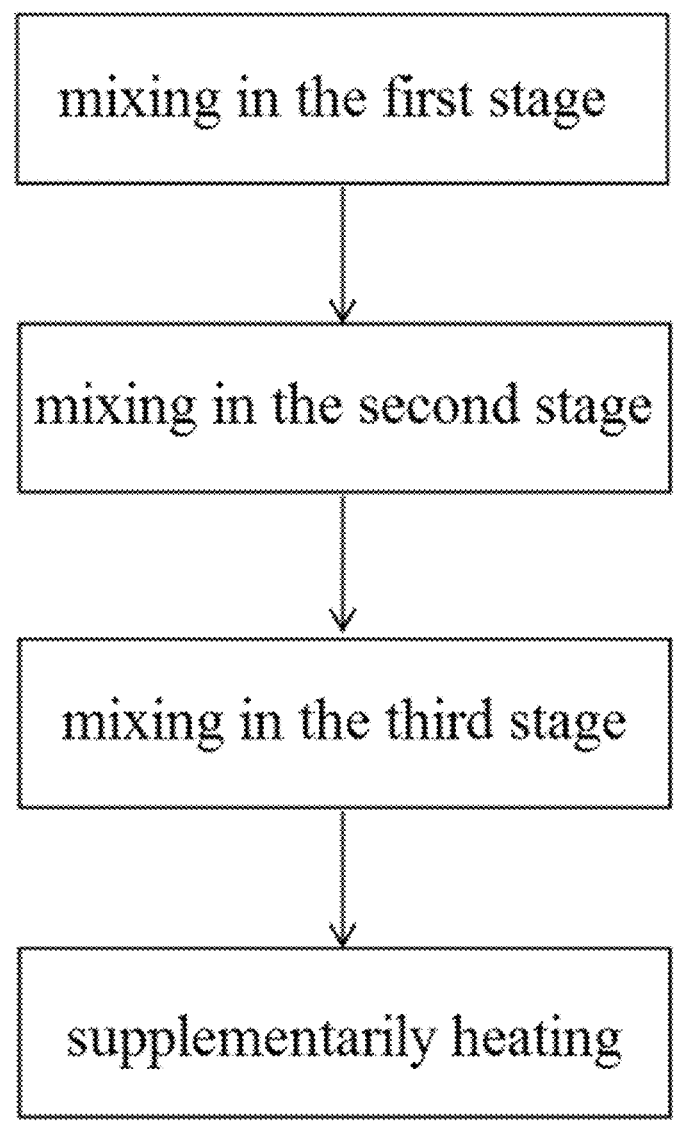
FIG. 1 is a flowchart of the method according to the present invention.

As shown in FIG. 1, the method of controlling mixed liquid to be delivered for SPM solution according to the present invention includes the step of: before the SPM solution comes into an acid scouring tank, mixing in the first stage, the second stage and the third stage and supplementarily heating in the delivering pipe in turn.

The method further includes the steps of heating while mixing during mixing in the first stage; further monitoring an oxygen concentration value of the mixed liquid flowing out after mixing in the first stage in real time; if the oxygen concentration value is smaller than an oxygen concentration value at full reaction, adding supplementary sulfuric acid and hydrogen peroxide at a specified volume ratio during mixing in the second stage, so as to enable the oxygen concentration value of the mixed liquid flowing out after mixing in the second stage monitored in real time to reach an oxygen concentration value at full reaction.

The method further includes the step of: if the temperature value of the mixed liquid flowing out after mixing in the first stage is smaller than a required value, continuing to heat during mixing in the second stage; if the temperature of the mixed liquid flowing out after mixing in the second stage is smaller than a required value, continuing to heat during mixing in the third stage.

The method further includes the step of: if the oxygen concentration value of the mixed liquid after mixing in the second stage or after mixing in the third stage mixing is smaller than an oxygen concentration value at full reaction, continuing to add supplementary sulfuric acid and hydrogen peroxide at a specified volume ratio at the time of mixing in the second stage.

The method further includes the step of: if the temperature value of the mixed liquid after mixing in the second stage is bigger than a required value, continuing to cool the mixed liquid at the time of mixing in the third stage.

The method further includes the step of: if the temperature value of the mixed liquid flowing out after mixing in the third stage is smaller than a required value, supplementarily heating the mixed liquid flowing out from mixing in the third stage in the delivering pipe.

Figure 2:
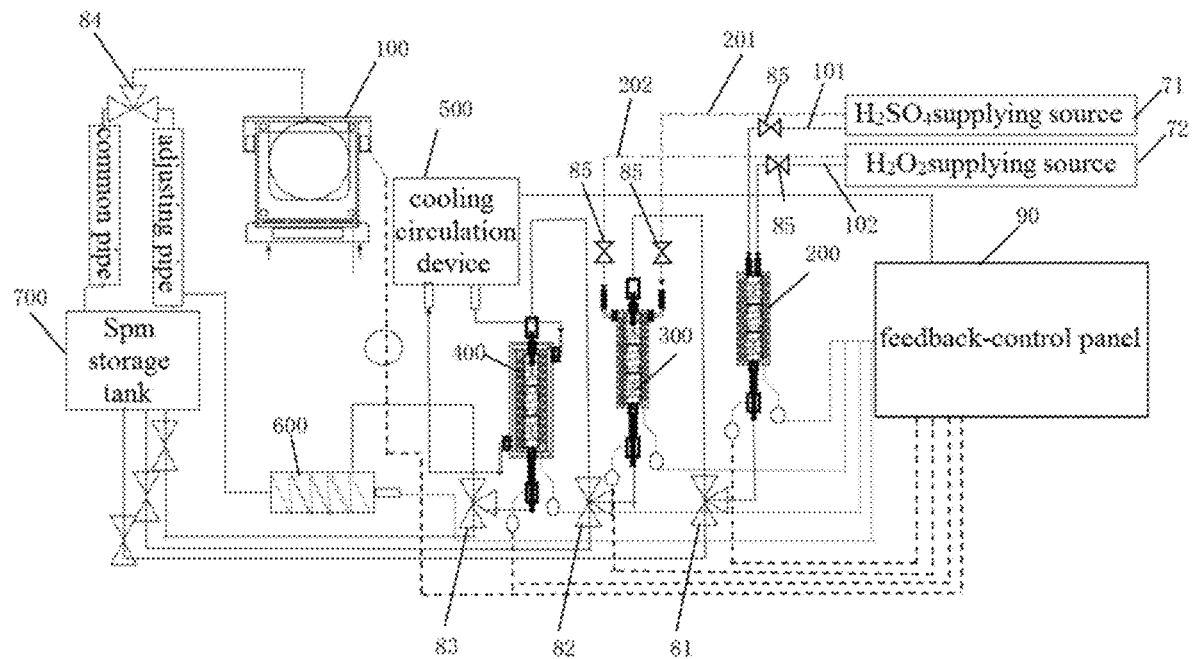
FIG. 2 is a structure diagram of the system adapted to the method according to the present invention.

In this example, the method according to the present invention is executed by a delivering system as shown in FIG. 2, the delivering system includes an acid scouring tank 100, a first mixing device 200, a second mixing device 300, a third mixing device 400, a cooling circulation device 500, a SPM storage tank 700, an auxiliary heater 600 and a feedback-control panel 90. The first mixing device 200 performs mixing in the first stage. The second mixing device 300 performs mixing in the second stage. The third mixing device 400 performs mixing in the third stage. The cooling circulation device 500 performs cooling the mixed liquid. The auxiliary heater 600 performs supplementarily heating the mixed liquid.

Figure 3:
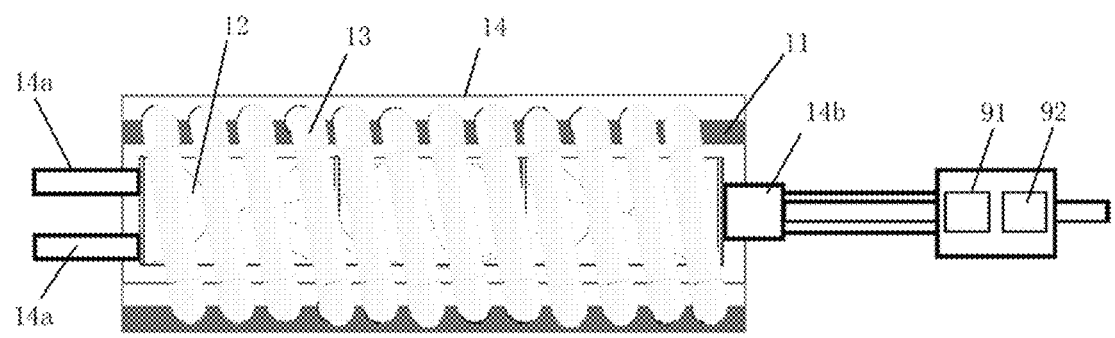
FIG. 3 is a structure diagram of the first mixing device according to the present invention.
Figure 4:
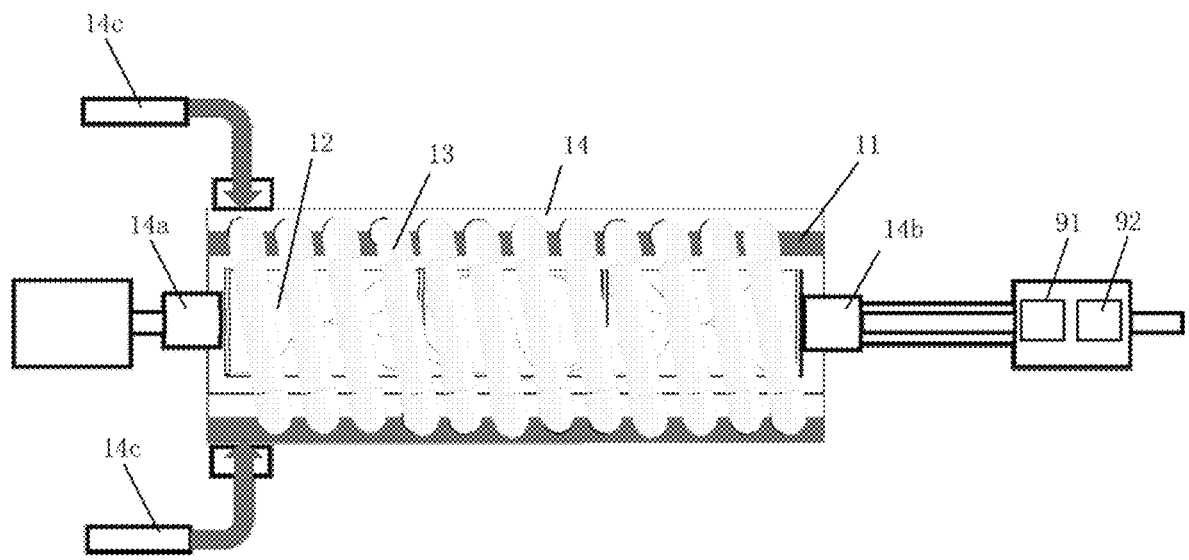
FIG. 4 is a structure diagram of the second mixing device according to the present invention.

As shown in FIGS. 3-4, the first mixing device 200, the second mixing device 300 and the third mixing device 400 each include a mixing duct 11, a multi-section mixing screw rod 12 arranged inside the mixing duct 11, a heater 13 wrapped around the mixing duct 11 and a heat preservation layer 14 positioned outside the heater 13. The heater 13 in this example is a heating tube wrapped around the mixing duct 11.

As shown by ways of combining FIG. 2 with FIG. 3, two principal inlets 14a are set on the inlet end of the first mixing device 200, and one principal outlet 14b is arranged on the outlet end of the first mixing device 200; two principal inlets 14a of the first mixing device 200 lead to a sulfuric acid supplying source 71 and a hydrogen peroxide supplying source 72 through a principal sulfuric acid pipe 101 and a principal hydrogen peroxide pipe 102, respectively; a flow valve 85 is arranged on each of the principal sulfuric acid pipe 101 and the principal hydrogen peroxide pipe 102.

As shown by ways of combining FIG. 2 with FIG. 4, one principal inlet 14a and two ancillary inlets 14c are set on the inlet end of the second mixing device 300; a principal outlet 14b is set on the outlet end of the second mixing device 300; the two ancillary inlets 14c of the second mixing device 300 lead to the sulfuric acid supplying source 71 and the hydrogen peroxide supplying source 72 through a sulfuric acid adjusting pipe 201 and a hydrogen peroxide adjusting pipe 202, respectively; the principal inlet 14a of the second mixing device 300 leads to the principal outlet 14b of the first mixing device 200 through a principal pipe; a flow valve 85 is arranged on each of the sulfuric acid adjusting pipe 201 and the hydrogen peroxide adjusting pipe 202.

Figure 5:
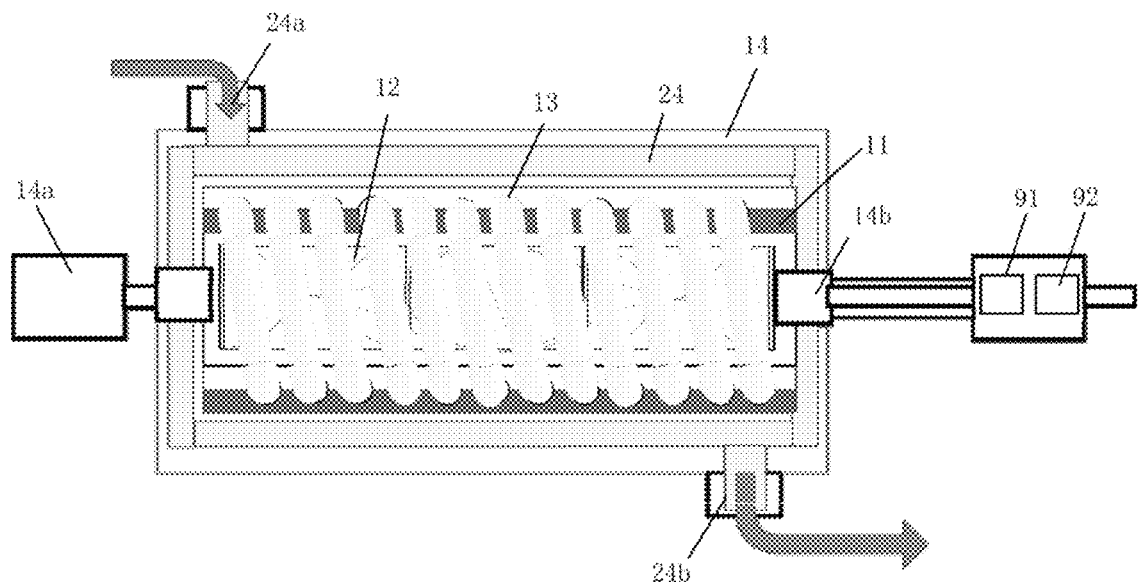
FIG. 5 is a structure diagram of the third mixing device according to the present invention.

As shown by ways of combining FIG. 2 with FIG. 5, the third mixing device 400 is provided with a cooling circulation passage 24 between the heating tube 13 and the heat preservation layer 14. One principal inlet 14a is set on an inlet end of the third mixing device 400, and one principal outlet 14b is set on an outlet end of the third mixing device 400. The cooling passage 24 is provided with a coolant inlet 24a and a coolant outlet 24b; the coolant inlet 24a and the coolant outlet 24b lead to the outlet end and the inlet end of the cooling circulation device 500 through the cooling passage, respectively.

The principal outlet 14b of the first mixing device 200 leads to the principal inlet 14a of the second mixing device 300 and a first inlet of the SPM storage tank 700 through a first three-way valve 81, respectively.

The principal outlet 14b of the second mixing device 300 leads to the principal inlet 14a of the third mixing device 400 and a second inlet of the SPM storage tank 700 through a second three-way valve 82, respectively.

The principal outlet 14b of the third mixing device 400 leads to an inlet of the auxiliary heater 600 and a third inlet of the SPM storage tank 700 through a third three-way valve 83, respectively.

An outlet of the SPM storage tank 700 and an outlet of the auxiliary heater 600 respectively lead to the acid scouring tank 100 through a fourth three-way valve 84.

The feedback-control panel 90 is electrically connected to the cooling circulation device 500, and used to control the cooling circulation device 500 to feed a circulating coolant into the third mixing device 400, so as to cool overheating mixed liquid that has come into the third mixing device 400, and enable the temperature of the mixed liquid to descend to a suitable value.

Figure 6:
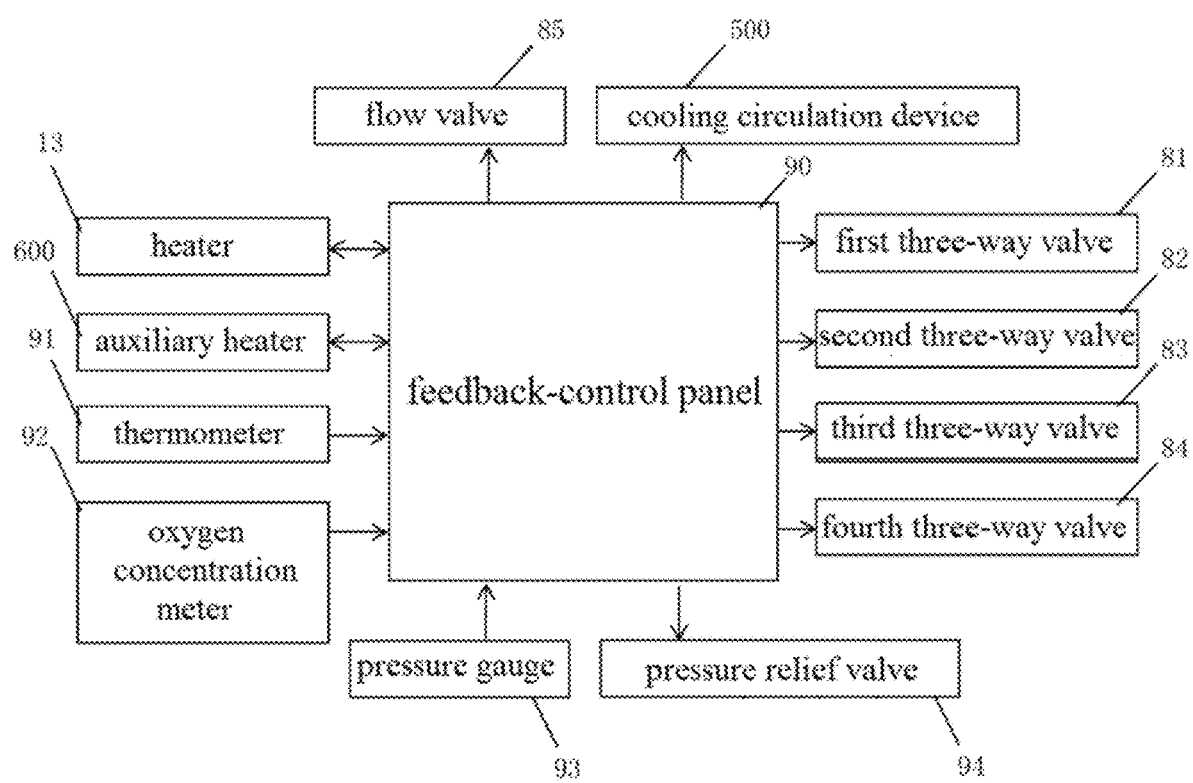
FIG. 6 is a block diagram showing an electrical connection of feedback-control in the present invention.

As shown in FIG. 6, the feedback-control panel 90 is electrically connected to each of the heater 13 of the first mixing device 200, the heater 13 of the second mixing device 300, the heater 13 of the third mixing device 400 and the auxiliary heater 600, in this way the feedback-control panel 90 can get the temperature values from feedback of these three heaters 13 and the auxiliary heater 600, and can simultaneously control these three heaters 13 and the auxiliary heater 600 to perform heating.

A thermometer 91 and an oxygen concentration meter 92 are arranged on each of the principal outlet of the first mixing device 200, the principal outlet of the second mixing device 300 and the principal outlet of the third mixing device 400, and inside the acid scouring tank 100; a pressure gauge 93 and a pressure relief valve 94 that lead to the interior of the mixing duct 11 are arranged on each of the first mixing device 200, the second mixing device 300 and the third mixing device 400; these thermometers 91, oxygen concentration gauges 92, pressure gauges 93 and pressure relief valves 94 are also electrically connected to the feedback-control panel 90.

The first, second, third and fourth three-way valves 81, 82, 83, 84 and the four flow valves 85 are also each electrically connected to feedback-control panel 90.

The delivering system in operation achieves controlling mixed liquid to be delivered for SPM solution, and its operation mode is as follows.

The sulfuric acid from the sulfuric acid supplying source 71 and the hydrogen peroxide form the hydrogen peroxide supplying source 72 are respectively delivered at a specified ratio into the mixing duct 11 of the first mixing device 100 via the principal sulfuric acid pipe 101 and the principal hydrogen peroxide pipe 102, and the sulfuric acid and the hydrogen peroxide at the time of gathering together collide with the spiral plane of the mixing screw rod 12 and make it rotate, in this way the shear force arising from this rotation can make the sulfuric acid and the hydrogen peroxide permeate through each other, and finally make the sulfuric acid and the hydrogen peroxide mix fully and evenly under the action of collision and rotation from the multi-section mixing screw rod. In the process of mixing, the heater of the first mixing device 200 heats the mixed liquid inside the pipe, and in the process of heating, on the one hand, the heater feeds back heating temperature to the feedback-control panel 90; on the other hand, the feedback-control panel 90 controls the heating temperature of the heater according to the feedback temperature.

The temperature and the oxygen concentration of the mixed liquid flowing out from the first mixing device 200 are respectively detected and fed back to the feedback-control panel 90 by means of the thermometer 91 and the oxygen concentration meter 92 arranged at the principal outlet of the first mixing device 200. If the temperature is lower than a required temperature value, the feedback-control panel 90 continues to control the heater of the second mixing device 300 to heat the mixed liquid flowing inside at the same moment that the second mixing device 300 further mixes the mixed liquid; if the oxygen concentration value is lower than a required concentration value, indicating inadequacy in reaction, thus the feedback-control panel 90 opens the flow valves on the sulfuric acid adjusting pipe 201 and the hydrogen peroxide adjusting pipe 202 to increase the fed-in volumes of sulfuric acid and hydrogen peroxide at a specified ratio toward the second mixing device 300 so as to enable a complete reaction.

The temperature of the mixed liquid flowing out from the second mixing device 300 is further detected and fed back to the feedback-control panel 90 by means of the thermometer 91 arranged at the principal outlet of the second mixing device 300. If the temperature is higher than a required temperature value, the feedback-control panel 90 controls the cooling circulation device to feed a circulating coolant into the cooling passage inside the third mixing device 400, so as to cool the mixed liquid; if the temperature is lower than a required temperature value, the feedback-control panel 90 controls the heater of the third mixing device 300 to heat the mixed liquid.

The temperature of the mixed liquid flowing out from the third mixing device 400 is further detected and fed back to the feedback-control panel 90 by means of the thermometer 91 arranged at the principal outlet of the third mixing device 400. If the temperature is lower than a required temperature value, the feedback-control panel 90 controls the auxiliary heater 600 to heat the mixed liquid, so as to make the mixed liquid finally meet the required temperature value.

The oxygen concentration of the mixed liquid flowing out is detected and fed back to the feedback-control panel 90 by means of the oxygen concentration meter 92 arranged at the principal outlet of the second mixing device 300 and the oxygen concentration meter 92 arranged at the principal outlet of the third mixing device 400. If an oxygen concentration value detected at any device is lower than a required concentration value, the feedback-control panel 90 opens the flow valves on the sulfuric acid adjusting pipe 201 and the hydrogen peroxide adjusting pipe 202 to increase the fed-in volumes of sulfuric acid and hydrogen peroxide at a specified ratio toward the second mixing device 300 so as to enable a complete reaction.

In the process of mixing, the pressure gauge monitors the pressure values in the first mixing device 200, the second mixing device 300 and the third mixing device 400 and feeds them back to the feedback-control panel 90. Once a gas pressure value in one of these mixing devices exceeds a set value, the feedback-control panel 90 can control the pressure relief valve arranged on this mixing device to open and relieve pressure, so as to guarantee system safety.

If the mixed liquid output from any mixing device is fully mixed and the temperature and oxygen concentration values respectively meet a required value, the mixed liquid can be directly delivered to the SPM storage tank for storage in heat preservation by the way of switching the first three-way valve 81, the second three-way valve 82 and the third three-way valve 83 of a corresponding mixing device.

It is possible to further decide whether the mixed liquid is supplied to the acid scouring tank 100 from the SPM storage tank 700 or directly through an adjusting pipe by the way of switching the fourth three-way valve 84.

By ways of describing the present invention in detail above, it can be seen that it is possible to realize fully mixing sulfuric acid with hydrogen peroxide in a mode of mixing in multi-stages, achieve precise control to temperature, and enable mixed liquid to fully react, thereby ensuring that the mixed liquid coming into the acid scouring tank meets cleaning requirements, and improving quality and efficiency of cleaning wafers.

What is claimed is:

1. A method of controlling mixed liquid to be delivered for a SPM solution formed by mixing sulfuric acid with hydrogen peroxide, comprising the steps of:
    before the SPM solution comes into an acid scouring tank, mixing the sulfuric acid with the hydrogen peroxide at a specified volume ratio in a delivering pipe in a first stage and a second stage in turn, so as to make a mixed liquid after mixing in the first stage to further get mixed in the second stage;
    heating the mixed liquid in the first stage;
    monitoring in real time an oxygen concentration value of the mixed liquid flowing out after mixing in the first stage;
    if the oxygen concentration value is smaller than an oxygen concentration value at full reaction, adding supplementary sulfuric acid and hydrogen peroxide at a specified volume ratio during mixing in the second stage, so as to enable the oxygen concentration value of the mixed liquid flowing out after mixing in the second stage monitored in real time to reach an oxygen concentration value at full reaction;
    making the mixed liquid flowing out after mixing in the second stage further get mixed in a third stage in the delivering pipe;
    if the temperature value of the mixed liquid flowing out after mixing in the first stage is smaller than a required value, continuing to heat during mixing in the second stage; and
    if the temperature value of the mixed liquid flowing out after mixing in the second stage is smaller than a required value, continuing to heat during mixing in the third stage.

2. The method of controlling mixed liquid to be delivered for the SPM solution according to claim 1, characterized in that the method further comprises the step of: if the oxygen concentration value of the mixed liquid after mixing in the second stage or after mixing in the third stage mixing is smaller than an oxygen concentration value at full reaction, continuing to add supplementary sulfuric acid and hydrogen peroxide at a specified volume ratio at the time of mixing in the second stage.

3. The method of controlling mixed liquid to be delivered for the SPM solution according to claim 1, characterized in that the method further comprises the step of: if the temperature value of the mixed liquid after mixing in the second stage is larger than a required value, cooling the mixed liquid at the time of mixing in the third stage.

4. The method of controlling mixed liquid to be delivered for the SPM solution according to claim 3, characterized in that in the first stage, the second stage and the third stage, the mixing is performed by using a mixing duct having a multi-section mixing screw rod inside.

5. The method of controlling mixed liquid to be delivered for the SPM solution according to claim 4, characterized in that the heating is performed by the way of wrapping a heating tube around the mixing duct to heat the mixed liquid inside the mixing duct.

6. The method of controlling mixed liquid to be delivered for the SPM solution according to claim 4, characterized in that the cooling is performed by way of feeding circulating cooling water outside the mixing duct to cool the mixed liquid inside the mixing duct.

7. The method of controlling mixed liquid to be delivered for the SPM solution according to claim 4, characterized in that the method further comprises the step of: if the temperature value of the mixed liquid flowing out after mixing in the third stage is monitored to be smaller than a required value, supplementarily heating the mixed liquid flowing out from mixing in the third stage in the delivering pipe.

8. The method of controlling mixed liquid to be delivered for the SPM solution according to claim 4, characterized in that the method further comprises the steps of: monitoring gas pressure values of the mixing duct, and if a monitored gas pressure value is higher than a set value, relieving pressure from the mixing duct.

9. The method of controlling mixed liquid to be delivered for the SPM solution according to claim 4, characterized in that the method further comprises the step of: delivering the mixed liquid the temperature and oxygen concentration values of which after mixing in any stage meet the required value directly to a SPM storage tank for storage in heat preservation, so as to get ready to directly deliver the SPM solution to the acid scouring tank.

* * * * *